United States Patent
Wang

(10) Patent No.: US 9,882,069 B2
(45) Date of Patent: Jan. 30, 2018

(54) BIASING VOLTAGE GENERATING CIRCUIT FOR AVALANCHE PHOTODIODE AND RELATED CONTROL CIRCUIT

(71) Applicant: Realtek Semiconductor Corp., Hsinchu (TW)

(72) Inventor: Shih-Wei Wang, Hualien County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 230 days.

(21) Appl. No.: 14/872,815

(22) Filed: Oct. 1, 2015

(65) Prior Publication Data
US 2016/0163886 A1    Jun. 9, 2016

(30) Foreign Application Priority Data

Dec. 3, 2014  (TW) .............................. 103141993 A

(51) Int. Cl.
*H01L 31/02*  (2006.01)
*G01J 1/44*  (2006.01)

(52) U.S. Cl.
CPC .......... *H01L 31/02027* (2013.01); *G01J 1/44* (2013.01); *G01J 2001/444* (2013.01); *G01J 2001/4466* (2013.01)

(58) Field of Classification Search
CPC ................ H01L 31/0207; H01L 31/10; H01L 31/02005; H04B 10/6911; G01J 1/44; G01J 1/4466; G01J 1/444; G01J 1/442
See application file for complete search history.

(56) References Cited

U.S. PATENT DOCUMENTS

| | | | | |
|---|---|---|---|---|
| 5,880,836 A | * | 3/1999 | Lonnqvist | ............... G01S 17/95 250/574 |
| 7,211,780 B2 | * | 5/2007 | Nishiyama | ........... H04B 10/691 250/214 R |

(Continued)

FOREIGN PATENT DOCUMENTS

| CN | 101871813 A | 10/2010 |
|---|---|---|
| CN | 102013676 A | 4/2011 |

OTHER PUBLICATIONS

Yang et al., "A 80V Output Voltage Boost Converter with Low Voltage Ripple for Avalanche Photodiode(APD)", IEEE, 2011, pp. 757-760.

(Continued)

*Primary Examiner* — Que T Le
*Assistant Examiner* — Jennifer Bennett
(74) *Attorney, Agent, or Firm* — Birch, Stewart, Kolasch & Birch, LLP

(57) ABSTRACT

A biasing voltage generating circuit for generating a required reverse biasing voltage of an avalanche photodiode (APD) includes: a boost power converter configured to operably convert an input voltage into a higher output voltage according to a feedback signal and a reference signal, and to apply the output voltage to be a reverse biasing voltage of the APD; a reference signal generating circuit configured to operably generate the reference signal; and a control circuit. The control circuit includes: a signal sensing circuit configured to operably generate a sensed signal corresponding to an output current of the APD; an analog-to-digital converter (ADC) configured to operably convert the sensed signal into a digital signal; and a processing circuit configured to operably adjust the feedback signal or the reference signal according to the digital signal to thereby (Continued)

control the boost power converter to adjust the output voltage.

2 Claims, 2 Drawing Sheets

(56) References Cited

U.S. PATENT DOCUMENTS

2003/0122533 A1 7/2003 Prescott
2004/0079866 A1 4/2004 Nishiyama
2004/0159776 A1* 8/2004 Richard .................. H03K 19/14
250/214 R

OTHER PUBLICATIONS

Chinese Office Action and Search Report issued in Chinese Application No. 201410754358.3 dated Sep. 27, 2017, together with a partial English translation.

* cited by examiner

BIASING VOLTAGE GENERATING CIRCUIT FOR AVALANCHE PHOTODIODE AND RELATED CONTROL CIRCUIT

CROSS-REFERENCE TO RELATED APPLICATIONS

This application claims the benefit of priority to Patent Application No. 103141993, filed in Taiwan on Dec. 3, 2014; the entirety of which is incorporated herein by reference for all purposes.

BACKGROUND

The disclosure generally relates to an avalanche photodiode and, more particularly, to a biasing voltage generating circuit of an avalanche photodiode and related control circuit.

Avalanche photodiodes are widely applied in many optical applications with higher sensitivity requirements, such as optical communication, optical distance measurement, etc. Ideally, a reverse biasing voltage applied to the avalanche photodiode should be designed to be close to but does not exceed the breakdown voltage of the avalanche photodiode in order to obtain better signal gain.

The signal gain of the avalanche photodiode has a very high correlation with both the magnitude of the reverse biasing voltage applied to the avalanche photodiode and the temperature. Therefore, a lookup table for recording the correlation between the temperature and the required reverse biasing voltage of the avalanche photodiode should be pre-stored in a conventional biasing voltage generating circuit of the avalanche photodiode. Due to the process deviation, however, different avalanche photodiodes have different correlations between the temperature and the required reverse biasing voltage.

In the conventional biasing voltage generating circuit, a boost power converter is typically employed to convert an input voltage into the required reverse biasing voltage of the avalanche photodiode. To maintain the stability of the reverse biasing voltage, the conventional biasing voltage generating circuit requires a DAC (digital-to-analog converter) to generate an analog signal according to the control values generated by a control circuit, and couples the analog signal to a voltage-divided signal generated by external divider resistors to from a feedback signal required for the operations of the boost power converter.

However, the circuit structure of the DAC is complex, and thus the DAC requires occupying more circuit area and higher hardware cost. Therefore, the entire circuitry architecture for the conventional biasing voltage generating circuit to control the boost power converter to generate the required reverse biasing voltage of the avalanche photodiode is too complex and costly.

SUMMARY

An example embodiment of a biasing voltage generating circuit for generating a required reverse biasing voltage of an avalanche photodiode is disclosed, comprising: a boost power converter, configured to operably convert an input voltage into a higher output voltage according to a feedback signal and a reference signal, and to apply the output voltage to be a reverse biasing voltage of the avalanche photodiode; a reference signal generating circuit, coupled with the boost power converter, configured to operably generate the reference signal; and a control circuit. The control circuit comprises: a signal sensing circuit, configured to operably generate a sensed signal corresponding to an output current of the avalanche photodiode; an analog-to-digital converter (ADC), coupled with the signal sensing circuit, configured to operably convert the sensed signal into a digital signal; and a processing circuit, coupled with the ADC, configured to operably adjust magnitude of the feedback signal or magnitude of the reference signal according to the digital signal to thereby control the boost power converter to adjust the output voltage.

An example embodiment of a control circuit of a biasing voltage generating circuit is disclosed. The biasing voltage generating circuit is utilized for generating a required reverse biasing voltage of an avalanche photodiode and comprises a boost power converter and a reference signal generating circuit. The boost power converter is configured to operably convert an input voltage into a higher output voltage according to a feedback signal and a reference signal, and to apply the output voltage to be a reverse biasing voltage of the avalanche photodiode. The reference signal generating circuit is coupled with the boost power converter and configured to operably generate the reference signal. The control circuit comprises: a signal sensing circuit, configured to operably generate a sensed signal corresponding to an output current of the avalanche photodiode; an analog-to-digital converter (ADC), coupled with the signal sensing circuit, configured to operably convert the sensed signal into a digital signal; and a processing circuit, coupled with the ADC, configured to operably adjust magnitude of the feedback signal or magnitude of the reference signal according to the digital signal to thereby control the boost power converter to adjust the output voltage.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
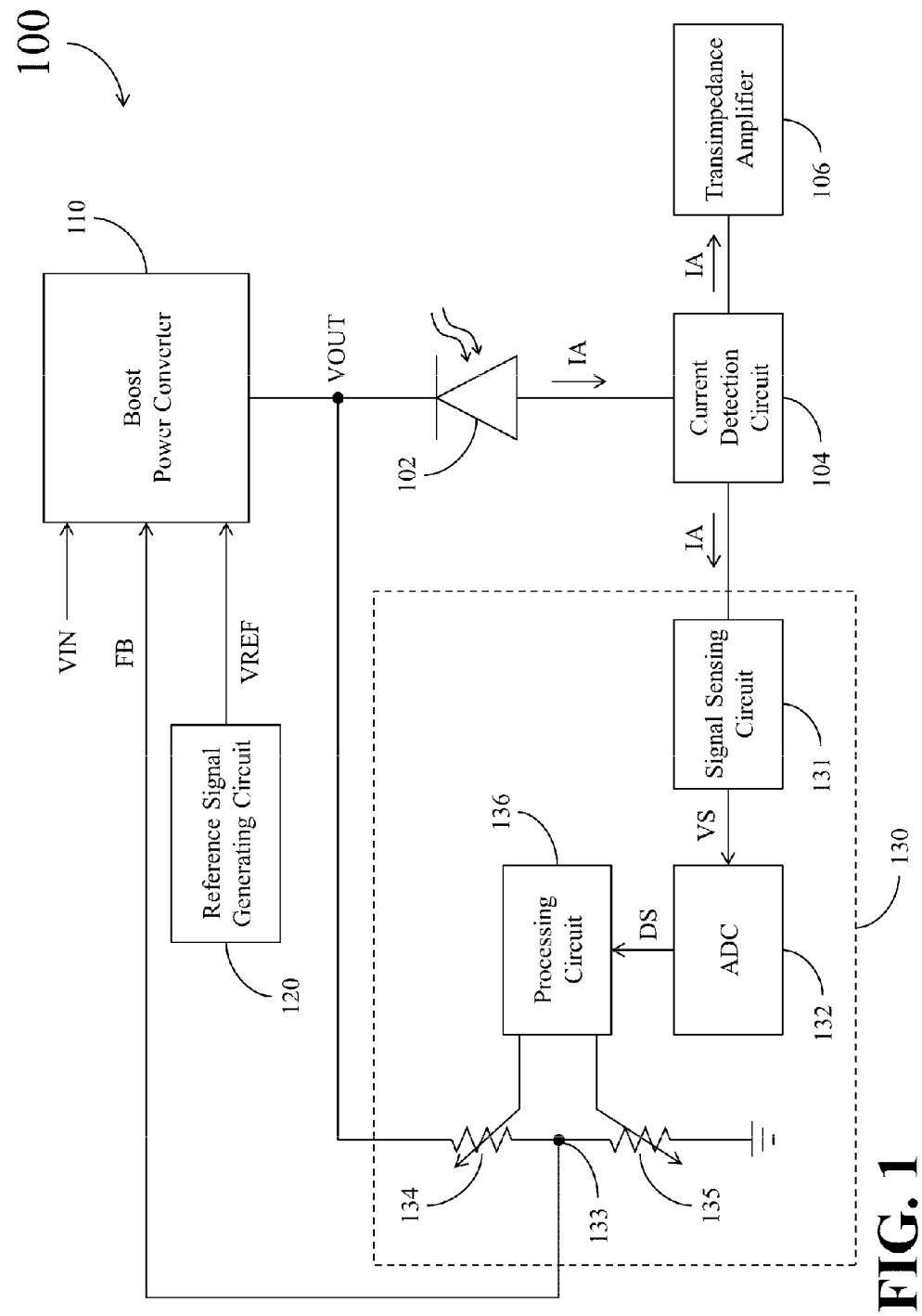
FIG. 1 shows a simplified functional block diagram of a biasing voltage generating circuit according to one embodiment of the present disclosure.

FIG. 1 shows a simplified functional block diagram of a biasing voltage generating circuit 100 according to one embodiment of the present disclosure. The biasing voltage generating circuit 100 is utilized for generating a required reverse biasing voltage of an avalanche photodiode 102. As shown in FIG. 1, the biasing voltage generating circuit 100 comprises a current detection circuit 104, a boost power converter 110, a reference signal generating circuit 120, and a control circuit 130.

In the biasing voltage generating circuit 100, the boost power converter 110 is configured to operably convert an input voltage VIN into a higher output voltage VOUT according to a feedback signal FB and a reference signal VREF, and to apply the output voltage VOUT to be a required reverse biasing voltage of the avalanche photodiode 102. When the output voltage VOUT generated by the boost power converter 110 reaches an operating voltage of the avalanche photodiode 102, the avalanche photodiode 102 generates a corresponding output current IA in response to the density of input light. The current detection circuit 104 is configured to operably detect the magnitude of the output current IA of the avalanche photodiode 102. The transimpedance amplifier 106 is configured to operably convert the output current IA of the avalanche photodiode 102 into a corresponding voltage signal to be demodulated by the receiving circuit (not shown) in the subsequent stage.

In addition, the reference signal generating circuit 120 is coupled with the boost power converter 110 and configured to operably generate the reference signal VREF. The control circuit 130 is configured to operably adjust the feedback signal FB required for the operations of the boost power converter 110 according to the output current IA of the avalanche photodiode 102, so as to raise the output voltage VOUT generated by the boost power converter 110 to a level close to but not exceeds the breakdown voltage of the avalanche photodiode 102 to obtain a higher signal gain.

In practice, the current detection circuit 104 may be realized with various current mirror structures. In addition, the boost power converter 110 may be realized with various synchronous-type or asynchronous-type boost power converters.

In the embodiment of FIG. 1, the control circuit 130 comprises a signal sensing circuit 131, an ADC (analog-to-digital converter) 132, a feedback node 133, a first variable resistor 134, a second variable resistor 135, and a processing circuit 136.

In the control circuit 130, the signal sensing circuit 131 is configured to operably generate a sensed signal VS corresponding to the magnitude if the output current IA of the avalanche photodiode 102. The ADC 132 is coupled with the signal sensing circuit 131 and configured to operably convert the sensed signal VS into a digital signal DS. The feedback node 133 is utilized for providing the feedback signal FB. The first variable resistor 134 is coupled between an output terminal of the boost power converter 110 and the feedback node 133. The second variable resistor 135 is coupled between the feedback node 133 and a fixed-voltage terminal (e.g., a ground terminal). The processing circuit 136 is coupled with the ADC 132 and configured to operably adjust the magnitude of the feedback signal FB according to the digital signal DS to thereby control the boost power converter 110 to adjust the magnitude of the output voltage VOUT. For example, the processing circuit 136 may be configured to operably change the resistance of at least one of the first variable resistor 134 and the second variable resistor 135 according to the digital signal DS, so as to adjust the magnitude of the feedback signal FB formed at the feedback node 133.

In practice, the signal sensing circuit 131 may be realized with various adequate resistors or a combination of resistors and capacitors to generate the sensed signal VS in the voltage form.

Additionally, different functional blocks of the biasing voltage generating circuit 100 may be realized with separate circuits, or may be integrated into a single chip. For example, all of the functional blocks of the control circuit 130 may be integrated into a single circuit chip, and the control circuit 130 may be integrated with at least one of the boost power converter 110, the reference signal generating circuit 120, and the current detection circuit 104 in to a single circuit chip.

In operations, the processing circuit 136 of the control circuit 130 may configure the resistances of the first variable resistor 134 and the second variable resistor 135 to have a predetermined voltage-dividing ratio, so as to render the output voltage VOUT of the boost power converter 110 to reach a predetermined level. When the avalanche photodiode 102 receives incoming light, if the output voltage VOUT generated by the boost power converter 110 is too low, the reverse biasing current IA outputted from the avalanche photodiode 102 would be too small, thereby causing the sensed signal VS generated by the signal sensing circuit 131 to have a too low voltage value.

In this situation, the ADC 132 transmits the resulting digital signal DS to the processing circuit 136. Then, the processing circuit 136 changes the voltage-dividing ratio of the first variable resistor 134 and the second variable resistor 135 by adjusting the resistance of at least one of the first variable resistor 134 and the second variable resistor 135. In this way, the processing circuit 136 controls the boost power converter 110 to gradually increase the output voltage VOUT until the processing circuit 136 makes sure from the digital signal DS that the output voltage VOUT of the boost power converter 110 reaches a required level to be the reverse biasing voltage of the avalanche photodiode 102.

It can be appreciated from the foregoing elaborations that no digital-to-analog converter (DAC) is required in the biasing voltage generating circuit 100, and thus the circuitry complexity and cost of the boost power converter 110 for generating the required reverse biasing voltage of the avalanche photodiode 102 can be effectively reduced.

In addition, there is no need to install other external divider resistors on the circuit board on which the biasing voltage generating circuit 100 resides, and thus the circuitry complexity and cost of the entire system can be further reduced.

Figure 2:
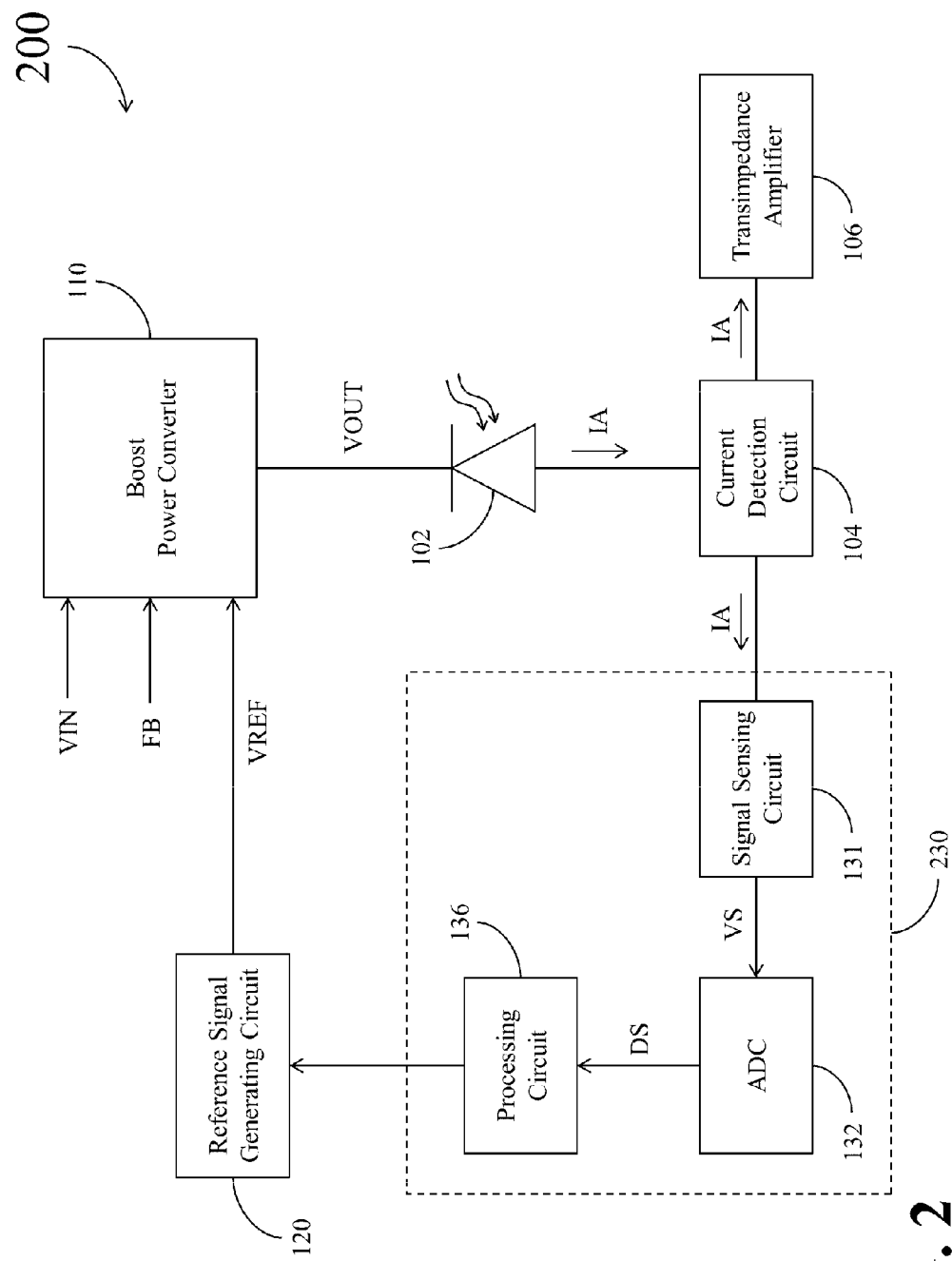
FIG. 2 shows a simplified functional block diagram of a biasing voltage generating circuit according to another embodiment of the present disclosure.

FIG. 2 shows a simplified functional block diagram of a biasing voltage generating circuit 200 according to another embodiment of the present disclosure. The biasing voltage generating circuit 200 is similar to the aforementioned biasing voltage generating circuit 100, but the control circuit 130 in the biasing voltage generating circuit 100 is replaced by a control circuit 230 in the biasing voltage generating circuit 200.

In the embodiment of FIG. 2, the control circuit 230 also comprises the aforementioned signal sensing circuit 131, the ADC 132, and the processing circuit 136, but the feedback node 133, the first variable resistor 134, and the second variable resistor 135 of the control circuit 130 are omitted.

As shown in FIG. 2, the processing circuit 136 of the control circuit 230 is further coupled with the reference signal generating circuit 120 and configured to operably control the reference signal generating circuit 120 according to the digital signal DS, so that the reference signal generating circuit 120 adjusts the magnitude of the reference signal VREF to achieve similar function of the previous embodiment.

In operations, for example, the processing circuit 136 of the control circuit 230 may control the reference signal generating circuit 120 to adjust the reference signal VREF to a predetermined magnitude, so as to render the output voltage VOUT of the boost power converter 110 to reach a predetermined level. When the avalanche photodiode 102 receives incoming light, if the output voltage VOUT generated by the boost power converter 110 is too low, the reverse biasing current IA outputted from the avalanche photodiode 102 would be too small, thereby causing the sensed signal VS generated by the signal sensing circuit 131 to have a too low voltage value.

In this situation, the ADC 132 transmits the resulting digital signal DS to the processing circuit 136. Then, the processing circuit 136 controls the reference signal generating circuit 120 to change the magnitude of the reference signal VREF to thereby control the boost power converter 110 to gradually increase the output voltage VOUT until the processing circuit 136 makes sure from the digital signal DS that the output voltage VOUT of the boost power converter 110 reaches a required level to be the reverse biasing voltage of the avalanche photodiode 102.

Similar to the previous embodiment, no digital-to-analog converter (DAC) is required in the biasing voltage generating circuit 200, and thus the circuitry complexity and cost of the boost power converter 110 for generating the required reverse biasing voltage of the avalanche photodiode 102 can be effectively reduced.

In addition, there is no need to install other external divider resistors on the circuit board on which the biasing voltage generating circuit 200 resides, and thus the circuitry complexity and cost of the entire system can be further reduced.

The foregoing descriptions regarding the connection relationships, implementations, connections, operations, and related advantages of other corresponding functional blocks in the biasing voltage generating circuit 100 are also applicable to the biasing voltage generating circuit 200. For the sake of brevity, those descriptions will not be repeated here.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The term "voltage signal" used throughout the description and the claims may be expressed in the format of a current in implementations, and the term "current signal" used throughout the description and the claims may be expressed in the format of a voltage in implementations.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A biasing voltage generating circuit for generating a required reverse biasing voltage of an avalanche photodiode, the biasing voltage generating circuit comprising:

a boost power converter, configured to operably convert an input voltage into a higher output voltage according to a feedback signal and a reference signal, and to apply the output voltage to be a reverse biasing voltage of the avalanche photodiode;

a reference signal generating circuit, coupled with the boost power converter, configured to operably generate the reference signal; and a control circuit, comprising:
 a signal sensing circuit, configured to operably generate a sensed signal corresponding to an output current of the avalanche photodiode;
 an analog-to-digital converter (ADC), coupled with the signal sensing circuit, configured to operably convert the sensed signal into a digital signal;
 a processing circuit, coupled with the ADC, configured to operably adjust magnitude of the feedback signal or magnitude of the reference signal according to the digital signal to thereby control the boost power converter to adjust the output voltage;
 a feedback node for providing the feedback signal;
 a first variable resistor, coupled between the feedback node and an output terminal of the boost power converter; and
 a second variable resistor, coupled between the feedback node and a fixed-voltage terminal;
 wherein the processing circuit is configured to operably change resistance of at least one of the first variable resistor and the second variable resistor according to the digital signal so as to adjust magnitude of the feedback signal.

2. A control circuit of a biasing voltage generating circuit, wherein the biasing voltage generating circuit is utilized for generating a required reverse biasing voltage of an avalanche photodiode and comprises a boost power converter and a reference signal generating circuit, the boost power converter is configured to operably convert an input voltage into a higher output voltage according to a feedback signal and a reference signal and to apply the output voltage to be a reverse biasing voltage of the avalanche photodiode, and the reference signal generating circuit is coupled with the boost power converter and configured to operably generate the reference signal, the control circuit comprising:

a signal sensing circuit, configured to operably generate a sensed signal corresponding to an output current of the avalanche photodiode;

an analog-to-digital converter (ADC), coupled with the signal sensing circuit, configured to operably convert the sensed signal into a digital signal;

a processing circuit, coupled with the ADC, configured to operably adjust magnitude of the feedback signal or magnitude of the reference signal according to the digital signal to thereby control the boost power converter to adjust the output voltage;

a feedback node for providing the feedback signal;

a first variable resistor, coupled between the feedback node and an output terminal of the boost power converter; and a second variable resistor, coupled between the feedback node and a fixed-voltage terminal;

wherein the processing circuit is configured to operably change resistance of at least one of the first variable resistor and the second variable resistor according to the digital signal so as to adjust magnitude of the feedback signal.

* * * * *